United States Patent [19]
Berbel

[11] Patent Number: 6,041,796
[45] Date of Patent: Mar. 28, 2000

[54] APPARATUS FOR DRYING OBJECTS WITH FLUIDS

[76] Inventor: Jose A. Berbel, 906 Kemp Hills Dr., Austin, Tex. 78737

[21] Appl. No.: 09/368,040

[22] Filed: Aug. 3, 1999

Related U.S. Application Data

[62] Division of application No. 09/169,721, Oct. 9, 1998, Pat. No. 5,989,359.

[51] Int. Cl.[7] .................................................. F26B 7/00
[52] U.S. Cl. ......................... 134/95.2; 134/111; 134/10; 134/26; 134/30; 134/31; 34/342
[58] Field of Search .................................. 134/95.2, 111, 134/102.3, 10, 26, 30, 31; 34/342

[56] References Cited

U.S. PATENT DOCUMENTS

| | | |
|---|---|---|
| 4,736,758 | 4/1988 | Kusuhara . |
| 4,911,761 | 3/1990 | McConnell et al. . |
| 4,924,890 | 5/1990 | Giles et al. . |
| 4,984,597 | 1/1991 | McConnell et al. . |
| 5,556,479 | 9/1996 | Bran . |
| 5,571,337 | 11/1996 | Mohindra et al. . |
| 5,634,978 | 6/1997 | Mohindra et al. . |
| 5,653,045 | 8/1997 | Ferrell . |
| 5,660,642 | 8/1997 | Britten . |
| 5,727,578 | 3/1998 | Matthews . |

*Primary Examiner*—Zeinab El-Arini
*Attorney, Agent, or Firm*—J. Nevin Shaffer, Jr.; Shaffer & Culbertson, LLP

[57] ABSTRACT

An apparatus for drying objects with fluids includes the introduction of an object (46) to be dried into a container (12). The container (12) is filled with a first fluid (48) from the bottom (16) of container (12) to a predetermined level. Subsequently, a volatile second fluid is introduced at the bottom (16) of container (12) so as to form a stable interface (56). Thereafter, volatile second fluid (50) is continued to be introduced into container (12) until first fluid (48), interface (56), and some portion of volatile second fluid (50) passes through exit (24) and two-way exit valve (26). At that point, pump (40), pumping volatile second fluid (50) into container (12), is stopped and two-way exit valve (26) closes so that residual first fluid (48) and volatile second fluid (50) pass through excess drain line (32) to first and second fluid recovery reservoir (34). Volatile second fluid (50) is extremely volatile, having a vapor pressure greater than 200 mm per Hg at STP, so that as object (26) is removed from volatile second fluid (50) or volatile second fluid (50) is allowed to drain from container (12), the thin film of volatile second fluid (50) evaporates instantly leaving completely dry object (46) free of either first fluid (48) or volatile second fluid (50) residues as well as free of any spotting or re-deposited particles. In a preferred embodiment, the first fluid (48) is water and the volatile second fluid (50) is an organic solvent with a specific gravity greater than 1.

10 Claims, 3 Drawing Sheets

APPARATUS FOR DRYING OBJECTS WITH FLUIDS

CROSS REFERENCE TO RELATED APPLICATION

This application is a divisional application of Ser. No. 09/169,721, filed Oct. 9, 1998, entitled "Method for Drying Objects with Fluids," by the same inventor, and now U.S. Pat. No. 5,989,359.

BACKGROUND OF THE INVENTION

This invention relates to an apparatus for drying objects with fluids.

Drying critical parts and objects is a crucial and important part of the overall manufacturing process in many fields and industries including, but not limited to, semiconductor, optical, metal, electronic packaging and assembly, medical, and others. In many cases, drying parts after a cleaning process is very important, if not essential. For different reasons, the reliability and future performance of the objects are closely related to the effectiveness and quality of the drying cycle. Different drying methods are utilized. Most common are the use of thermal energy and gas flow, vapor drying, rotational spinning, water dissolution, capillary dry, water dispersion, and Marangoni flow effects.

A brief discussion of these prior art drying methods is necessary in order to more fully understand the shortcomings of the prior art solutions to drying objects.

1. Thermal drying. These methods are relatively effective but have clear limitations in that they are time-consuming, they consume considerable amounts of energy, and, most critically, they create "spotting" on the surfaces due to water evaporation leaving behind dissolved salts and particles.

2. Vapor drying. This method utilizes a solvent capable of forming a water azetrope which is heated into a vapor phase and then is directed to contact the objects to be dried for the removal of water residues. This method is highly effective although it is limited by safety/hazard concerns since the solvents that are used are generally flammable. Further, it also consumes considerable energy.

3. Rotational spinning. This method spins the object to be dried and then typically includes a stage whereby a heated gas is directed on the object. Although this method minimizes "spotting" by removing the water droplets by means of centrifugal forces prior to evaporation, it too has clear limitations. Only certain types of flat objects can be arranged in a spinning apparatus. Moreover, the objects maintain physical contact with the holders or attachments, thus introducing a source for physical deterioration and particle contamination.

4. Marangoni flow effect. This method consists of spraying a small amount of alcohol vapor on a water surface under which the objects are immersed. The objects to be dried are then slowly lifted. At the water surface, the alcohol lowers the water surface tension, enhancing "wetability" consequently. The alcohol droplets form an upper layer that forces the water to be removed from the surface of the objects as they are lifted from the water bath. This methodology has been widely accepted, in the semiconductor industry in particular. However, this technology is generally used in conjunction with a thermal drying method where a hot nitrogen flow is directed toward the surface of the object in order to aid in the drying of the residual alcohol/water film left on the surface of the object. As with thermal drying, spotting is a problem as well as the fact that forced gas movement inside the drying chamber has the potential of inducing particle redeposition by the flow of residual particles.

5. Capillary dry. This method is very similar to the Marangoni flow method described above. In this method, objects are immersed in a hot water bath. They are then slowly pulled upwards out of the hot water bath. At the water/air interface, the capillary forces of the water tend to pull most of the water residue off of the object. Generally, a thin water layer is left behind on the surface. Since hot water is used, this layer will tend to evaporate very rapidly, particularly if a hot gas flow is applied to the surface of the object as well. As with the previous Marangoni method, particle re-deposition and spotting may occur.

6. Water displacement. This method involves the use of a highly volatile halogenated solvent aided by a surfactant. The objects to be dried are immersed in the solvent where the surfactant attaches to the surfaces of the objects, replacing the water as a result. The objects are then lifted from the liquid and placed in a solvent vapor zone where condensation takes place and the surfactant is removed by the solvent. This method is not considered highly reliable because it is difficult to determine whether all the surfactant has been removed from the objects' surfaces.

7. Water dissolution. This method is very similar to the water displacement process. In this case, however, the highly volatile solvent relies on a small amount of 2-Propanol which is used to dissolve water residues. The main limitation of this method is that the solvent/alcohol blend becomes "loaded" with water relatively fast, which essentially renders the solvent spent and useless.

These methods and procedures are exemplified by way of example, to the best of the Applicant's knowledge in the following United States patents: Matthews, U.S. Pat. No. 5,727,578; Britten, U.S. Pat. No. 5,660,642; Bran, U.S. Pat. No. 5,556,479; Ferrell, U.S. Pat. No. 5,653,045; Mohindra, et al., U.S. Pat. Nos. 5,571,337 and 5,634,978; Giles, et al., U.S. Pat. No. 4,924,890; Kusukara, U.S. Pat. No. 4,736,758; and McConnell, et al., U.S. Pat. Nos. 4,984,597 and 4,911,761. Each of these suffers from the disadvantages set forth above including but not limited to the use of solvents that do not completely dry items, thereby requiring additional processing steps such as the use of ultraviolet drying procedures, as well as the need for the interaction of mechanical devices to move the materials to be dried, among others.

Again, all of the prior art of which the inventor is aware suffers from one or more of the above-described limitations. Thus, there is a need in the art for providing an apparatus for drying objects which does not involve the use of thermal energy, does not use extremely flammable solvents, is not limited exclusively to thin, flat objects, does not require sophisticated and expensive equipment, upon which the drying effectiveness is not dependent upon the number of cycles or frequency of usage, and, most importantly, an apparatus by which the drying cycle time is faster and which prevents particle re-deposition and spotting on an object's surface. It, therefore, is an object of this invention to provide and improved object drying apparatus using fluids to dry objects quickly and without spotting and re-deposition of particles.

SHORT STATEMENT OF THE INVENTION

Accordingly, the object drying mechanism of the present invention includes a container for temporarily holding fluids and an object to be dried. A valve is connected to an exit of the container and a first fluid inlet is provided for introducing a first fluid into the container. A second fluid inlet for introducing a volatile second fluid beneath said first fluid is also provided. The volatile second fluid has a specific gravity greater than the first fluid, forms a stable interface with the first fluid, and is not miscible in the first fluid. As the volatile second fluid is introduced into the container, the first fluid is pushed over the object and out of the exit of the container. The residue of the volatile second fluid quickly evaporates from the object to be dried, thereby drying the object quickly, inexpensively, and without the risk of the re-deposition of particles on the object.

In a preferred embodiment, the invention includes a removably attachable cap to provide access to the container with the cap having a decreasing diameter so as to form a funnel shape until it approximately matches the size of the exit. Further, in a preferred embodiment, the container includes a drain and the drain is connected to a reservoir of ultra-pure volatile second fluid. The reservoir is connected to a pump, the pump is connected to a filter, and the filter is connected to the second fluid inlet. Further, in a preferred embodiment, the exit is connected to a first fluid recovery reservoir and also to a first fluid and a volatile second fluid recovery reservoir. In a preferred embodiment then, the volatile second fluid is pumped into the container from beneath the first fluid, thereby scrubbing the object with the first and second fluids as the second fluid pushes the first fluid to the exit. As the first fluid exits, it is initially directed to the first fluid recovery reservoir where only the first fluid is recovered. Subsequently, as the volatile second fluid passes the exit, the introduction of the volatile second fluid is stopped. At that point, the exit valve is closed and simultaneously the connection to the first fluid and the volatile second fluid recovery reservoir is opened. By these means then the first fluid may be recovered to a large extent for recycling and the mixture of the first and second fluids is also captured and easily recycled.

In a preferred embodiment, the first fluid is water and the volatile second fluid is an organic solvent with a specific gravity greater than 1, that is not soluble in water, that forms a stable interface and that is non-reactive with water. In a preferred embodiment, the organic solvent has a vapor pressure greater than 200 mm Hg at STP.

BRIEF DESCRIPTION OF THE DRAWINGS

Other objects, features, and advantages of the present invention will become more fully apparent from the following detailed description of the preferred embodiment, the appended claims, and the accompanying drawings in which:

DETAILED DESCRIPTION OF THE PREFERRED EMBODIMENT

Figure 1:
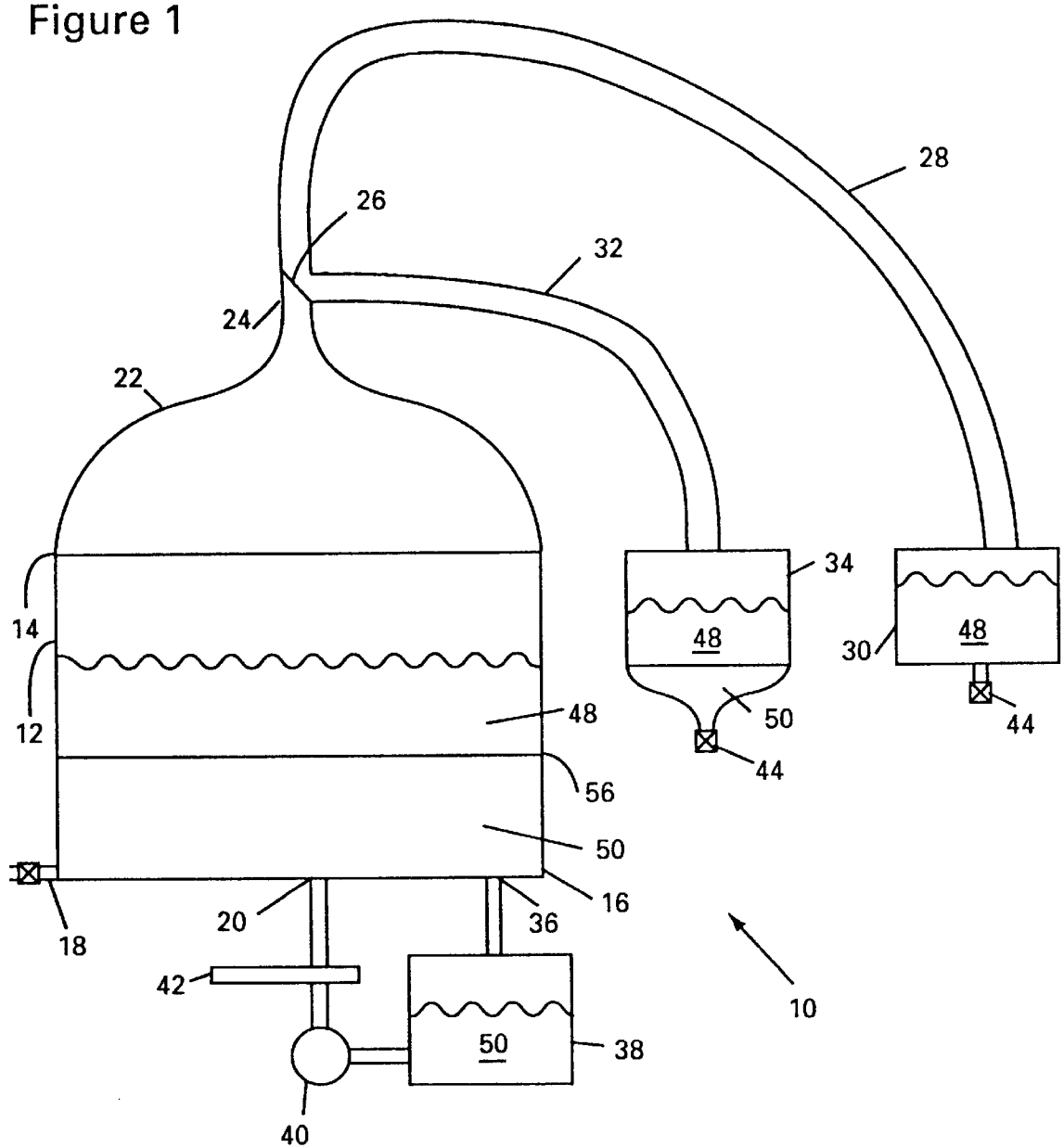
FIG. 1 is a plan view of a preferred embodiment of the apparatus for drying objects with fluids.

The preferred embodiment of the present invention is illustrated by way of example in FIGS. 1–7. With specific reference to FIGS. 1 and 2, an object dryer 10 includes container 12 with a top 14 and a bottom 16. The bottom 16 includes first fluid inlet 18 and second fluid inlet 20. In a preferred embodiment, container 12 also includes a removably attachable top 22 shaped in a funnel form. That is, the sides of removably attachable top 22 decrease in diameter until they approximately match the size of exit 24. Exit 24 includes two-way exit valve 26. In a preferred embodiment, two-way exit valve 26 is connected by overflow line 28 to a first fluid recovery reservoir 30. Also, two-way exit valve 26 is connected by means of excess drain line 32 to combination first and second fluid recovery reservoir 34.

In a preferred embodiment, container 12 also includes drain 36 connected to reservoir 38 containing ultra-pure second fluid 20. Reservoir 38 is connected to pump 40 which is connected to particulate filter 42, which in turn is connected to second fluid inlet 20. First fluid recovery reservoir 30 and first and second fluid recovery reservoir 34 each contain a drain 44 for the controlled release of fluids contained therein.

Figure 2:
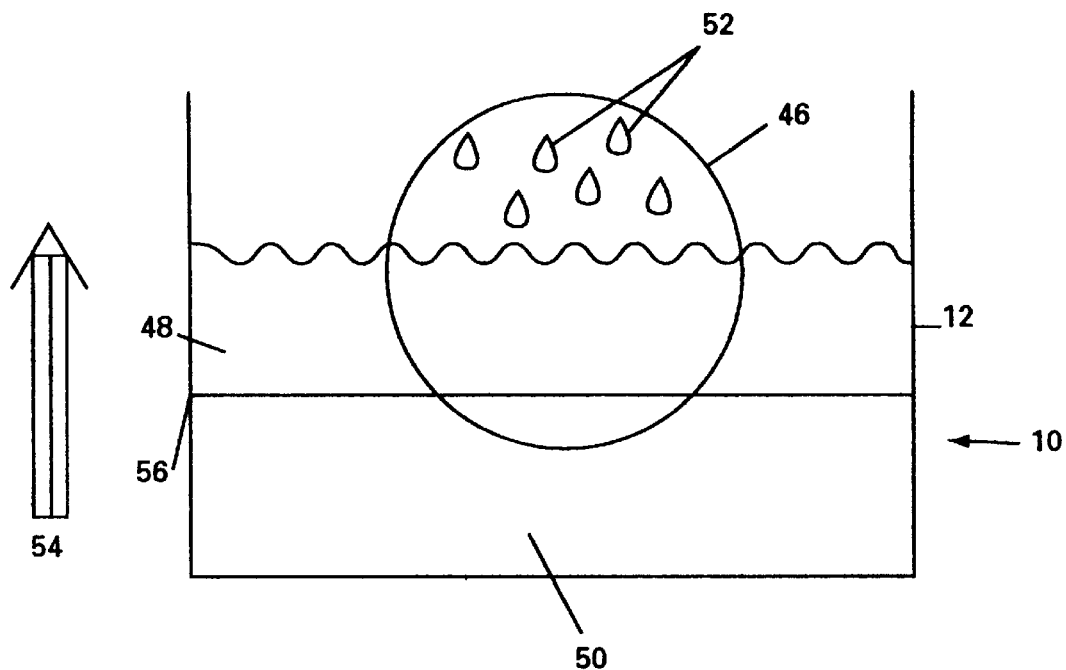
FIG. 2 is an illustration of fluid flow in the preferred embodiment of the invention.

Referring now specifically to FIG. 2, object 46 is shown located within container 12. Object 46, in a preferred embodiment, will have just been removed from an aqueous solution or wash and placed in container 12. At the point shown in FIG. 2, object 12 is partially covered by first fluid 48, volatile second fluid 50, and residual rinse water droplets 52. In a preferred embodiment, first fluid 48 is introduced through first fluid inlet 18 in the bottom 16 of container 12. Subsequent to the introduction of the first fluid 48 in an amount sufficient for the object 46 in question, volatile second fluid 50 is introduced to the bottom 16 of the container 12 through second fluid inlet 20. The direction of fluid flow in container 12, therefore, is from the bottom 16 to the top 14 of container 12 in the direction of arrow 54. As volatile second fluid 50 is continued to be introduced to container 12, the stable interface 56 formed between first fluid 48 and volatile second fluid 50 moves upward in the direction of arrow 54 across object 46. In accordance with the invention, volatile second fluid 50 has a specific gravity greater than first fluid 48, is not miscible in first fluid 48, and forms a stable interface 56 with first fluid 48. In a preferred embodiment, first fluid 48 is water and volatile second fluid 50 is an organic solvent with a specific gravity greater than 1 and which, again, is non-reactive with water.

Figure 3:
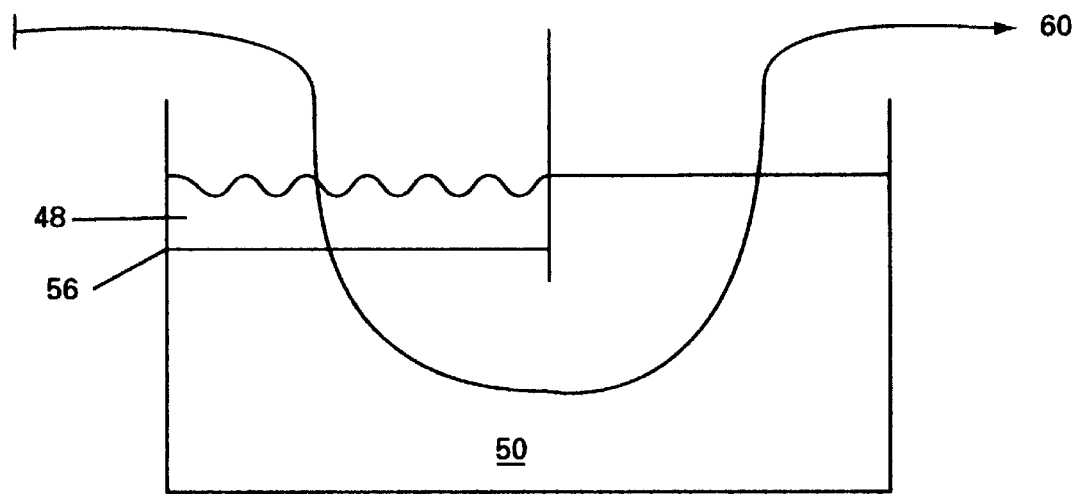
FIG. 3 is a side view of another preferred embodiment of the invention wherein the object is moved through the fluids.
Figure 4:
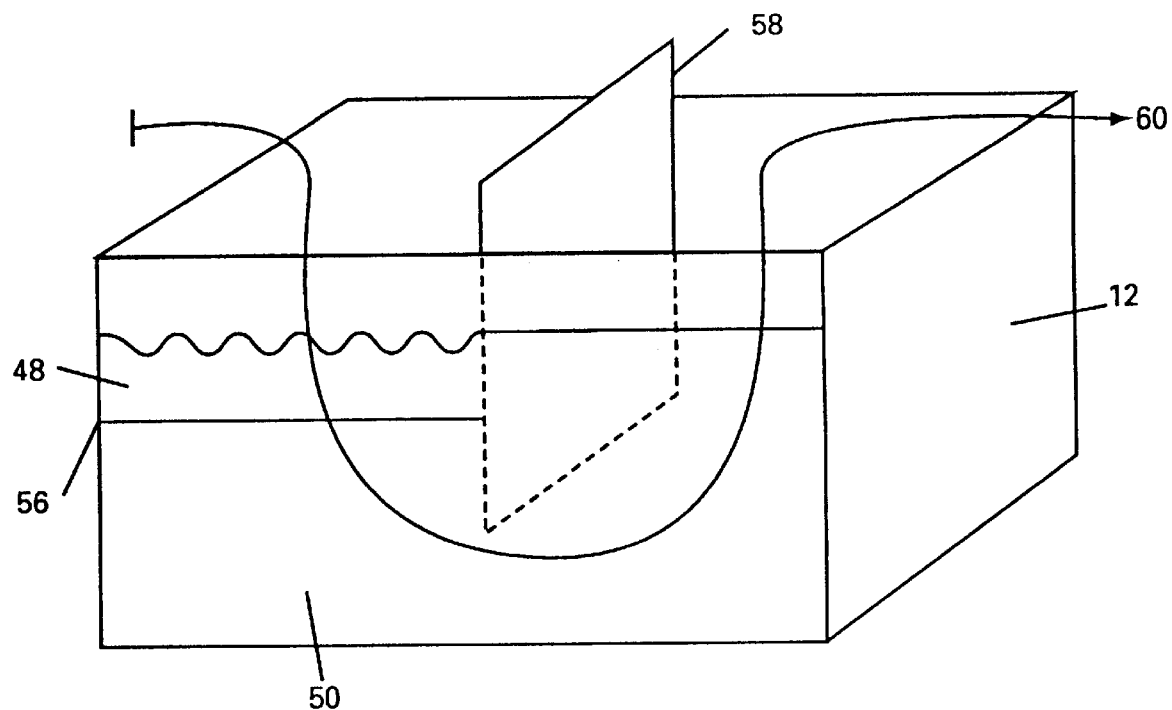
FIG. 4 is a perspective view of the embodiment of the invention shown in FIG. 3.

Referring now to FIGS. 3 and 4, a preferred embodiment of the invention is disclosed wherein instead of first fluid 48 followed by volatile second fluid 50 washing over a stationary object 46, object 46 is introduced to a container 12 with a central divider 58. Central divider 58 prevents first fluid 48 from covering the entire top surface of container 12 so that the required steps of the process, as set forth above, for fluid drying of object 46 occurs in that object 46, when introduced along path 60, first is washed by first fluid 48, then by volatile second fluid 50 until it is removed from container 12. In either case, only a thin film of volatile second fluid 50 remains on object 46 at the end of the process. In a preferred embodiment, volatile second fluid 50 is extremely volatile, having a vapor pressure greater than 200 mm Hg at STP, so that object 46 is rapidly and completely dried free of either aqueous or organic residues.

Figure 5:
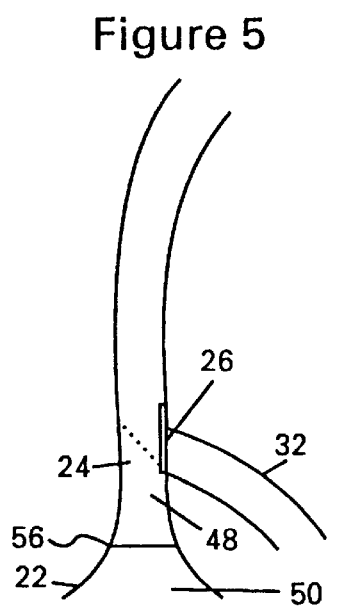
FIG. 5 is a close-up view of the two-way exit valve of the embodiment of the invention illustrated in FIG. 1, showing the valve in the open position.
Figure 6:
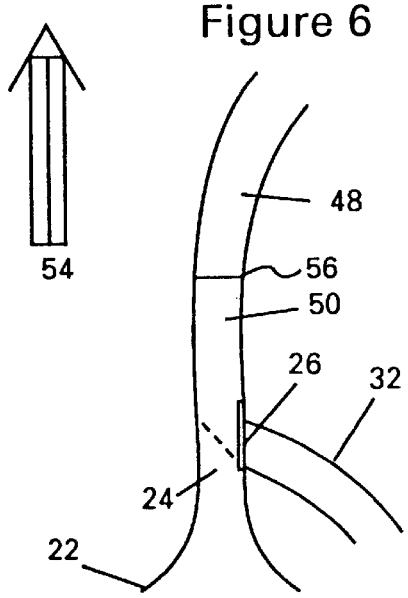
FIG. 6 is a view showing the two-way exit valve in the open position as the first fluid and second fluid interface and the second fluid have passed the two-way exit valve.
Figure 7:
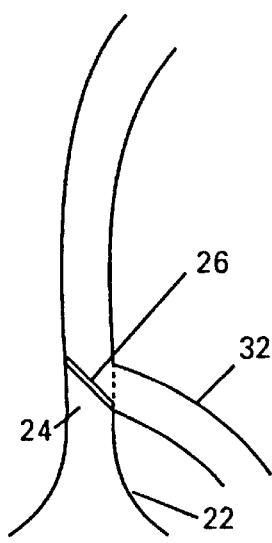
FIG. 7 is a illustration of the two-way exit valve in the closed position whereby residual first and second fluids are allowed to flow to the first and second fluid recovery reservoir.

Referring to FIGS. 5, 6, and 7, the operation of two-way exit valve 26 is disclosed in detail. FIG. 5 illustrates first fluid 48 approaching the exit 24 at the top 14 of container 12. That is, first fluid 48 is yet to pass exit 24 and so neither has interface 56 nor any of volatile second fluid 50. Flow is in the direction of arrow 54, again. As volatile second fluid 50 is continued to be introduced to the bottom 16 of container 12, first fluid 48, interface 56, and a small amount of volatile second fluid 50 pass by exit 24 and two-way exit valve 26. Up to this point, two-way exit valve 26 leaves the exit 24 open while at the same time closing excess drain line 32.

Referring now to FIG. 1, for a while, then, first fluid 48 is free to flow through overflow line 28 to first fluid recovery reservoir 30. Prior to such time as interface 56 and second volatile fluid 50 flow into first fluid recovery reservoir, however, the introduction of volatile second fluid 50 is stopped. At that point, two-way exit valve 26 closes exit 24, as shown in FIG. 7, and the combination of the remnants of first fluid 48 and volatile second fluid 50 pass, by gravity or otherwise, through excess drain line 32 to first and second fluid recovery reservoir 34. Two-way valve 26 can be any valve type known in the art, such as a flapper valve, for example.

In operation, object 46 is brought to object dryer 10 after an aqueous wash or rinse. Object 46 is placed in container 12 and removably attachable top 22 is connected to container 12 and exit 24 containing two-way exit valve 26. Removably attachable top 22 is connected to container 12 by any means known in the art such as a compatible elastomer.

After the object(s) 46 is placed in container 12, a predetermined amount of first fluid 48 is introduced to the bottom 16 of container 12 through first fluid inlet 18. In a preferred embodiment, first fluid 48 is de-ionized (DI) water. Thereafter, volatile second fluid 50 is introduced to the bottom 16 of container 12 through second fluid inlet 20 and forms a stable interface 56 thereby. In a preferred alternative embodiment, the full amount of first fluid 48 is introduced to container 12 as part of the rinse cycle. This prevents any exposure of the surfaces of object 46 to water/air interfaces so that even minimal amounts of spotting are prevented. In either case, volatile second fluid 50 is pumped at a predetermined flow rate by pump 40 through particulate filter 42 into container 12. The inventor has determined that the ideal flow rate depends on several factors, most particularly on the nature of the drying application and the physical dimensions of container 12. The inventor has determined that most applications will require a flow velocity of no more than 10 centimeters per minute inside container 12.

Ultimately, first fluid 48 reaches the narrow end of funnel-shaped removably attachable top 22 and exit 24. First fluid 48 is continuously passed through over-flow line 28 into first fluid recovery reservoir 30. Eventually, there is a point where the interface 56 passes beyond two-way exit valve 26. In a preferred embodiment, this distance is between 3 to 5 centimeters above twoway exit valve 26. At that point, pump 40 stops delivering volatile second fluid 50 and two-way exit valve 26 closes exit 24 while at the same time opening excess drain line 32. As a result, residual amounts of first fluid 48 and volatile second fluid 50 in overflow line 28 drain, by gravity or otherwise, through excess drain line 32 to first and second fluid recovery reservoir 34.

Concurrently, the remaining second volatile fluid 50 inside container 12 is drained by way of drain 36 to reservoir 38. The time sequence of pump 40 operation and two-way exit valve 26 can be easily automated and controlled by computer or programmable logic controller, as is known in the art, based on preferred pre-calibrated time functions, which are, of course, dependent on the shape and volume of the container 12 and the desired/selected fluid flow rates.

At this point, the dry cycle of the invention is completed by a rapid evaporation from the surfaces of object 46 of volatile second fluid 50.

Reservoir 38 serves the purpose of recovering the residual volatile second fluid 50 by gravity, in a preferred embodiment. Once recovered, volatile second fluid 50 can be purified and recycled or simply transferred for a proper chemical disposal. This is also true with the first fluid 48 contained in first fluid recovery reservoir 30 and the combination of first fluid 48 and volatile second fluid 50 contained in first fluid and volatile second fluid recovery reservoir 34.

By way of the operation of the invention, the inventor has determined that the upper first fluid 48 initially absorbs residual rinse water droplets 52 into a continuous first fluid phase. The volatile second fluid 50, when in contact with first fluid 48 reduces the surface tension of first fluid 48 at interface 56, resulting in effective "wetability" of the surface of object 46. This enables capillary forces of the first fluid 48 to pull any remaining residual rinse water droplets 52 with it in an upward direction of arrow 54. Therefore, by means of operation of object dryer 10, first fluid 48, water, residues are effectively removed from surface of object 46 prior to drying. Essentially, any remaining particles in the first fluid 48 tend to attain a localized position at the interface 56. Since this interface 56 moves only in an upward direction, it ultimately ends in a higher position than the top of object 46, therefore physically preventing particle re-deposition.

The solubility of volatile second fluid 50 with first fluid 48 and vice versa should be minimal, on the order of less than 0.5% by weight. Further, the inventor has determined that the flow direction 54, or movement of object 46, must be so that object 46 comes in contact with second volatile fluid 50 last. Further, thin, flat objects can be dried at flow velocities of 10.0 centimeters per minute while other objects with cylindrical and spherical geometries may require a slower flow velocity. The inventor has also determined that the best drying effect occurs when the volatile second fluid 50 level is pumped at least 5% higher than the height of object 46. Further, for best operation, first fluid 48 must comprise a layer at least 3.0 centimeters high.

While any volatile second fluid 50 which has a specific gravity greater than the first fluid 48, is not miscible in the first fluid 48, forms a stable interface therewith, and which is volatile could be used, the inventor has determined that two preferred embodiments of volatile second fluid 50 work well. The first is a solvent blend of 1,1,1,2,3,4,4,5,5,5-Decafluoropentane, Trans,1,2-Dichloroethylene, Methanol, and Nitromethane. The second is a solvent blend of Methoxy-Nonafluorobutane, Trans,1,2-Dichloroethylene, and Methanol. Certainly, the reliability and effectiveness of object dryer 10 is by no means limited to these two blends. In fact, the solvent blend can be optimized so that the solvent-water interface exhibits certain properties related to interfacial tensions and surface contact angles in order to prevent particle re-deposition more effectively or even to implement the proposed method to actually remove particles that adhere to surfaces. The effect of the solvent-water interface 56 on different surfaces and particles simply depends on factors such as their hydrophobic or hydrophillic nature.

While the preferred embodiment of the present invention has been disclosed in particular for use with the semiconductor industry, it should be obvious that Applicant's invention can be used in any situation where the requirements for complete drying and the absence of particles and spotting on a clean surface after drying is absolute. For example, in the medical profession, oxygen tubes require periodic cleaning. In many cases, these tubes are washed in water with soaps or detergents. Then they must be dried completely for the reason that where there is water, there is bacteria. The present invention can be utilized by passing the first fluid, second fluid combination through the tube. The fluids would then be collected in a reservoir for future use. Essentially, this scrubbing action occurs in the container 12 of the present invention so that the inside of the container 12 is always clean and ready for reuse as a practical side benefit of the invention.

While the present invention has been disclosed in connection with the preferred embodiment thereof, it should be understood that there may be other embodiments which fall within the spirit and scope of the invention as defined by the following claims.

I claim:

1. An apparatus for drying objects with fluids comprising:
   (a) a container for temporarily holding fluids and an object to be dried;
   (b) a valve connected to an exit at a top of said container;
   (c) a first fluid inlet at a bottom of said container for introducing a first fluid into said container;
   (d) a second fluid inlet at the bottom of said container for introducing a volatile second fluid, with a specific gravity greater than said first fluid and not miscible with said first fluid so that a stable interface with said first fluid is formed, beneath said first fluid, so that as said volatile second fluid is introduced to said container said first fluid is pushed over said object and out of said exit at said top of said container; and
   (e) a second fluid drain at the bottom of said container for draining said volatile second fluid from said container.

2. The apparatus of claim 1 wherein said container further comprises:
   (a) a removably attachable cap; and
   (b) said cap having a decreasing diameter forming a funnel shape connected to said exit.

3. The apparatus of claim 2 wherein said drain is connected to a reservoir of ultra-pure volatile second fluid, said reservoir is connected to a pump, said pump is connected to a filter, and said filter is connected to said second fluid inlet.

4. The apparatus of claim 1 wherein said valve further comprises:
   (a) a connection to a first fluid recovery reservoir; and
   (b) a connection to a first fluid and a volatile second fluid recovery reservoir.

5. The apparatus of claim 1 wherein said first fluid is water and said volatile second fluid is an organic solvent with a specific gravity greater than 1, which is non-reactive with water.

6. The apparatus of claim 5 wherein said organic solvent is selected from a group including a solvent blend of 1,1,1,2,3,4,4,5,5,5-Decafluoropentane; Trans,1,2-Dichloroethylene; Methanol; and Nitromethane; and a solvent blend of Methoxy-Nonafluorobutane; Trans,1,2-Dichloroethylene; and Methanol.

7. The apparatus of claim 5 wherein said organic solvent has a vapor pressure greater than 200 mm Hg at STP.

8. An apparatus for drying objects with fluids comprising:
   (a) a container for temporarily holding fluids and an object to be dried;
   (b) a first fluid inlet at a bottom of said container for introducing a first fluid into said container;
   (c) a second fluid inlet at said bottom of said container for introducing a volatile second fluid, with a specific gravity greater than said first fluid and not miscible with said first fluid so that a stable interface with said first fluid is formed beneath said first fluid;
   (d) said container formed so that as said object is introduced to said container said first fluid is pushed over said object followed by said volatile second fluid and said object is then removed directly from said volatile second fluid; and
   (e) a second fluid drain at the bottom of said container for draining said volatile second fluid from said container.

9. The apparatus of claim 8 wherein said first fluid is water and said volatile second fluid is an organic solvent with a specific gravity greater than one, which is non-reactive with water.

10. The apparatus of claim 9 wherein said organic solvent is selected from a group including a solvent blend of 1,1,1,2,3,4,4,5,5,5-Decaflouropentane; Trans,1,2-Dichloroethylene; Methanol; and Nitromethane; and a solvent blend of Methoxy-Nonaflourobutane; Trans,1,2-Dichloroethylene; and Methanol.

* * * * *